(12) United States Patent
Kurita et al.

(10) Patent No.: US 7,915,145 B2
(45) Date of Patent: Mar. 29, 2011

(54) SILICON SUBSTRATE AND MANUFACTURING METHOD THEREOF

(75) Inventors: Kazunari Kurita, Tokyo (JP); Shuichi Omote, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/391,723

(22) Filed: Feb. 24, 2009

(65) Prior Publication Data

US 2009/0218661 A1    Sep. 3, 2009

(30) Foreign Application Priority Data

Feb. 29, 2008  (JP) ................. 2008-049847

(51) Int. Cl.
  *H01L 21/322*  (2006.01)
(52) U.S. Cl. ................... 438/471; 257/E21.318
(58) Field of Classification Search .......... None
  See application file for complete search history.

(56) References Cited

U.S. PATENT DOCUMENTS

| | | | |
|---|---|---|---|
| 5,571,373 A * | 11/1996 | Krishna et al. | 438/693 |
| 5,874,348 A | 2/1999 | Takizawa et al. | |
| 7,677,955 B2 * | 3/2010 | Kajiyama et al. | 451/11 |
| 2004/0166684 A1 * | 8/2004 | Koike | 438/690 |
| 2005/0214973 A1 * | 9/2005 | Oyu et al. | 438/106 |
| 2007/0207595 A1 * | 9/2007 | Kurita | 438/473 |
| 2009/0256241 A1 * | 10/2009 | Kurita et al. | 257/617 |

FOREIGN PATENT DOCUMENTS

| | | |
|---|---|---|
| JP | 6-338507 | 12/1994 |
| JP | 2006-313922 | 11/2006 |

OTHER PUBLICATIONS

U.S. Appl. No. 12/397,399, filed Mar. 4, 2009, and entitled "Silicon Substrate and Manufacturing Method of the Same".
U.S. Appl. No. 12/396,656, filed Mar. 3, 2009, and entitled "Silicon Substrate and Manufacturing Method Thereof".
U.S. Appl. No. 12/396,631, filed Mar. 3, 2009, and entitled "Method of Manufacturing Silicon Substrate".

* cited by examiner

*Primary Examiner* — Benjamin P Sandvik
(74) *Attorney, Agent, or Firm* — Greenblum & Bernstein, P.L.C.

(57) ABSTRACT

A silicon substrate is manufactured from single-crystal silicon which is grown to have a carbon concentration equal to or higher than $1.0 \times 10^{16}$ atoms/cm$^3$ and equal to or lower than $1.6 \times 10^{17}$ atoms/cm$^3$ and an initial oxygen concentration equal to or higher than $1.4 \times 10^{18}$ atoms/cm$^3$ and equal to or lower than $1.6 \times 10^{18}$ atoms/cm$^3$ by a CZ method. A device is formed on a front, the thickness of the silicon substrate is equal to or more than 5 μm and equal to or less than 40 μm, and extrinsic gettering which produces residual stress equal to or more than 5 Mpa and equal to or less than 200 Mpa is applied to a back face of the substrate.

9 Claims, 7 Drawing Sheets

SILICON SUBSTRATE AND MANUFACTURING METHOD THEREOF

BACKGROUND OF THE INVENTION

1. Field of the Invention

The present invention relates to a silicon substrate and a silicon substrate manufacturing method, and particularly, to a technique which is preferably used for a silicon substrate having improved gettering performance and provided for manufacturing a thin device such as a memory or a logic device.

Priority is claimed on Japanese Patent Application No. 2008-049847, filed Feb. 29, 2008, the content of which is incorporated herein by reference.

2. Description of Related Art

A thin silicon semiconductor device is manufactured by forming a circuit on a silicon substrate sliced from single-crystal silicon pulled in accordance with a czochralski (CZ) method. When impurities such as heavy metal are incorporated in the silicon substrate, device characteristics greatly deteriorate.

A first cause of the incorporation of impurities such as heavy metals in the silicon substrate is metal contamination in a silicon substrate manufacturing process including pulling of a single crystal, slicing, chamfering, and surface processing such as polishing, grinding and etching. A second cause thereof is a heavy-metal contamination in a device manufacturing process including a process of abrading a back face of a wafer to reduce the thickness to about 50 μm after the formation of a circuit on the silicon substrate.

Accordingly, an intrinsic gettering (IG) method of forming oxygen precipitates in a silicon substrate and an extrinsic gettering (EG) method of forming a gettering site such as a backside damage in a back face of a silicon substrate have been used.

Japanese Unexamined Patent Application, First Publication No. 6-338507 discloses a processing technique using the IG method. Japanese Unexamined Patent Application, First Publication No. 2006-313922 discloses an example of the EG method in the paragraph [0005] and a technique related to a carbon ion injection.

As described above, a silicon substrate which is used in a solid-state image sensing device is obtained by the intrinsic gettering method of forming oxygen precipitates by performing a heat treatment for oxygen precipitation before epitaxial growth, or an ion injection method of injecting ions such as carbon ions into a silicon substrate.

In recent years, a device thinning process has been performed and the thicknesses of devices are required to be from 50 μm to 40 μm or less, specifically, about 30 μm. However, heavy-metal contamination mostly occurs particularly in the thinning process as a final device manufacturing process. In the case of the above conventional intrinsic gettering (IG) method, a large portion of an IG layer exhibiting an IG effect is removed in the thinning process if the thickness of the device has been reduced to be in the above range. Therefore, sufficient gettering performance is not exhibited and a problem occurs in that the causes of device malfunction are formed.

In addition, as disclosed in Japanese Unexamined Patent Application, First Publication No. 2006-313922, when a high-temperature heat treatment is performed on a substrate into which carbon is injected, crystal defects (crystal lattice distortion and the like) formed by the carbon injection are reduced and thus there is concern that a function of the defects as gettering sinks deteriorate.

The invention is contrived in view of the above problems, and an object of the invention is to provide a silicon substrate, which has sufficient gettering performance and in which the occurrence of cracking or chipping can be prevented, even when being thinned, thereby improving the yield of the device, and a silicon substrate manufacturing method.

SUMMARY OF THE INVENTION

A silicon substrate according to the invention is manufactured from single-crystal silicon which is grown to have a carbon concentration equal to or higher than $1.0 \times 10^{16}$ atoms/$cm^3$ and equal to or lower than $1.6 \times 10^{17}$ atoms/$cm^3$ and an initial oxygen concentration equal to or higher than $1.4 \times 10^{18}$ atoms/$cm^3$ and equal to or lower than $1.6 \times 10^{18}$ atoms/$cm^3$ by a CZ method. A device is formed on a front of the silicon substrate, the thickness of the silicon substrate is equal to or more than 5 μm and equal to or less than 40 μm, and extrinsic gettering which produces residual stress equal to or more than 5 Mpa and equal to or less than 200 Mpa is applied to a back face of the substrate.

It is preferable that the residual stress of the silicon substrate according to the invention is applied by subjecting the back face of the silicon substrate to grinding and subsequent CMP processing.

It is preferable that the residual stress on the silicon substrate according to the invention is applied by subjecting the back face of the silicon substrate to grinding and subsequent CMP processing using a hard slurry which has a hardness equal to or more than 200 HV and equal to or less than 1000 HV and is formed of colloidal silica, crystal silicon or diamond-like carbon.

In a silicon substrate manufacturing method according to the invention, first, a single-crystal silicon which has a carbon concentration equal to or higher than $1.0 \times 10^{16}$ atoms/$cm^3$ and equal to or lower than $1.6 \times 10^{17}$ atoms/$cm^3$ and an initial oxygen concentration equal to or higher than $1.4 \times 10^{18}$ atoms/$cm^3$ and equal to or lower than $1.6 \times 10^{18}$ atoms/$cm^3$ is grown by a CZ method. Next, a wafer is manufactured by slicing the single-crystal silicon, a device is formed on a front of the wafer, and the thickness of the wafer in which the device is formed is reduced up to 5 μm or more and 40 μm or less. To a back face of the wafer, a process of applying extrinsic gettering which produces residual stress equal to or more than 5 Mpa and equal to or less than 200 Mpa is performed. In this manner, the silicon substrate according to the invention can be obtained and thus the above object can be solved.

The process of producing the residual stress may include grinding and subsequent CMP processing subjected to the back face of the silicon substrate.

It is preferable that the process of producing the residual stress includes grinding subjected to the back face of the silicon substrate and subsequent CMP processing using a hard slurry which has a hardness equal to or more than 200 HV and equal to or less than 1000 HV and is formed of colloidal silica, crystal silicon or diamond-like carbon.

A silicon substrate of a memory device according to the invention can be manufactured by the above-described manufacturing method.

The above oxygen concentration can be measured by ASTM F121-1979.

The above carbon concentration can be measured by a method using FT-IR.

The hardness can be measured by a method using a Vickers hardness tester.

A silicon substrate according to the invention, which is suitable for manufacturing a solid-state image sensing device, a logic device, a memory device and the like, has a nuclei of precipitates formed by adding carbon (gettering sinks of heavy metal). Particularly, even in a thinning process and subsequent processes in a final device manufacturing process, the silicon substrate according to the invention exhibits sufficient gettering performance by IG and EG and the occurrence of cracking and chipping can be prevented.

By using the silicon substrate in manufacturing of a memory device, a logic device and the like, defects resulting from heavy metal contamination are not formed in a circuit, a transistor, a buried diode and the like constituting a device, and the yield of the device element can be improved.

Accordingly, according to the invention, a silicon substrate in which the influence of metal contamination can be reduced by its high gettering performance can be provided. By such a silicon substrate, problems in manufacturing cost, poor yield in the device process, and the like can be solved.

DETAILED DESCRIPTION OF THE INVENTION

Figure 1A:
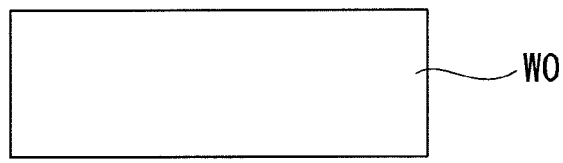
FIGS. 1a to 1c are sectional views illustrating an embodiment of a silicon substrate manufacturing procedure.

Hereinafter, an embodiment of a silicon substrate and a silicon substrate manufacturing method according to the invention will be described on the basis of the drawings.

FIGS. 1a to 1c and FIGS. 2a to 2c are sectional views illustrating processes of the silicon substrate manufacturing method according to this embodiment. FIG. 3 is a flowchart illustrating the silicon substrate manufacturing method according to this embodiment. In the drawings, reference symbol W0 is a silicon substrate.

In this embodiment, a silicon substrate, which is used for manufacturing a device such as a memory device, will be described.

The silicon substrate manufacturing method according to this embodiment has a wafer manufacturing process A and a device manufacturing process B. The wafer manufacturing process A has a single-crystal silicon pulling process S1, a wafer processing process S2 and an epitaxial layer forming process S3, as illustrated in FIG. 3. The device manufacturing process B has a device forming process S4, a thinning process S5 and a finishing process S6, as illustrated in FIG. 3.

First, in the single-crystal silicon pulling process S1 illustrated in FIG. 3, polysilicon as a raw material for crystal silicon is heaped up in a vitreous silica crucible. Further, an appropriate amount of a graphite powder is applied to a surface of the polysilicon, and B (boron) as dopant is added thereto at the same time. Then, in accordance with, for example, a czochralski method (CZ method), the polysilicon and the like are molten, and in this melt, seed-crystal silicon is dipped and pulled in a hydrogen atmosphere. In this manner, a CZ crystal to which carbon is added is produced as described later. The CZ crystal is the name of a crystal produced by the czochralski method and includes a CZ crystal to which a magnetic field is applied.

For the pulling of p type single-crystal silicon including boron, carbon is added to polysilicon which is a raw material, a single-crystal silicon is grown from a melt of the raw material to which the carbon is added, and the oxygen concentration Oi in the single crystal is controlled. Hereinafter, the pulling of CZ single-crystal silicon to which carbon is added will be described. A description of a wafer having a diameter of 300 mm will be made, but the invention is not limited to this.

Figure 4:
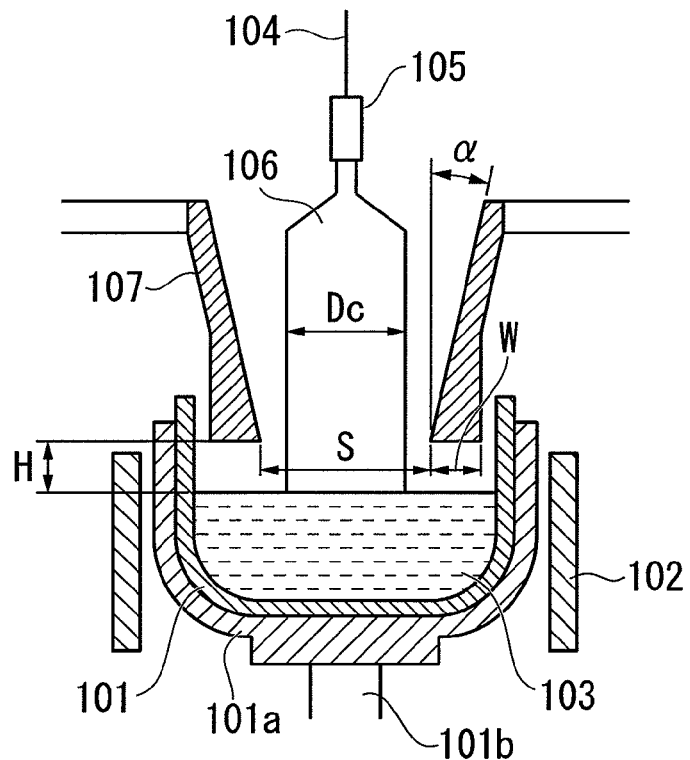
FIG. 4 is a longitudinal sectional view of a CZ pulling furnace.

FIG. 4 is a longitudinal sectional view of a CZ furnace suitable for manufacturing a single-crystal silicon according to this embodiment. The CZ furnace includes a crucible (vitreous silica crucible) 101 disposed at the center of a chamber and a heater 102 disposed outside the crucible 101. The CZ furnace has a double structure so that the inner vitreous silica crucible 101 containing a raw material melt 103 is held by an outer graphite crucible 101a. The crucible 101 is rotated and moves up and down by a support shaft 101b referred to as a pedestal. A cylindrical heat shielding body 107 is provided above the crucible 101. An outer shell of the heat shielding body 107 is made of graphite and the inside of the outer shell is filled with graphite felt. An inner face of the heat shielding body 107 is tapered so that an inner diameter from an upper end to a lower end gradually decreases. An outer face of an upper portion of the heat shielding body 107 is formed into a tapered face corresponding to the inner face and an outer face of a lower portion of the heat shielding body 107 is formed into a substantially straight (vertical) face, and thus the thickness of the lower portion of the heat shielding body 107 gradually increases toward the lower side.

With the CZ furnace in this embodiment, it is possible to grow a single crystal having a diameter of 300 mm and a body length of, for example, 1200 mm with a target diameter (DC) of, for example, 310 mm.

An example of specifications of the heat shielding body 107 is as follows. An outer diameter of a portion entering the crucible is, for example, 570 mm, a minimum inner diameter S at the lowest end is, for example, 370 mm, and the width (thickness) W in a radial direction is, for example, 100 mm. In addition, an outer diameter of the crucible 101 is, for example, 650 mm, and a height H from a melt level to the lower end of the heat shielding body 107 is, for example, 60 mm. An inclination α of the tapered face is, for example, 21°.

Next, a method of setting processing conditions for growing a CZ single-crystal silicon to which carbon is added will be described.

First, high-purity polycrystalline silicon is put in the crucible, and boron is added thereto as a dopant so that resistivity in the crystal corresponds to a p-type substrate.

The boron (B) concentration of a p+ type substrate corresponds to a resistivity equal to or more than $8 \times 10^{-3}$ Ωcm and equal to or less than $10 \times 10^{-3}$ Ωcm, the boron concentration of a p type substrate corresponds to a resistivity equal to or more than 0.1 Ωcm and equal to or less than 100 Ωcm, and the boron concentration of a p− type substrate corresponds to a resistivity equal to or more than 0.01 Ωcm and equal to or less than 0.1 Ωcm.

A p/p− type wafer has a p type epitaxial layer laminated on a p− type substrate.

The resistivity can be measured using a 4-probe resistivity measuring device.

In this embodiment, dopant is added to a silicon melt so that the carbon concentration in a silicon substrate is equal to or higher than $1.0 \times 10^{16}$ atoms/cm$^3$ and equal to or lower than $1.6 \times 10^{17}$ atoms/cm$^3$.

Moreover, the crystal rotating speed, the crucible rotating speed, the heating conditions, the applied magnetic field conditions, the pulling speed, and the like are controlled, so that the oxygen concentration in the silicon substrate is equal to or higher than $1.4 \times 10^{18}$ atoms/cm$^3$ and equal to or lower than $1.6 \times 10^{18}$ atoms/cm$^3$.

In addition, in an inert gas atmosphere, the pressure in the device is reduced to be equal to or higher than 1.33 kPa and equal to or lower than 26.7 kPa (equal to or higher than 10 torr and equal to or lower than 200 torr), and hydrogen gas is mixed with inert gas (Ar gas or the like) and introduced into the furnace to be equal to or more than 3 vol % and equal to or less than 20 vol %. The pressure is preferably not lower than 1.33 kPa (10 torr), more preferably equal to or higher than 4 kPa and equal to or lower than 26.7 kPa (equal to or higher than 30 torr and equal to or lower than 200 torr), and even more preferably equal to or higher than 4 kPa and equal to or lower than 9.3 kPa (equal to or higher than 30 torr and equal to or lower than 70 torr). When the hydrogen partial pressure is lowered, the hydrogen concentration in the melt and the crystal is lowered. Thus, the lower limit of the pressure is determined to prevent the occurrence of this problem. When the pressure in the furnace increases, the carbon concentration in the crystal becomes higher than a desired value and dislocation is generated in the crystal. Thus, an upper limit of the pressure is determined to prevent the occurrence of this problem. When the pressure in the furnace increases, the gas flow rate of the inert gas such as Ar on the melt decreases and thus it becomes difficult to discharge the carbon degassed from a carbon heater or a carbon member and reaction gas such as SiO evaporating from the melt, so the carbon concentration in the crystal becomes higher than the desired value. Moreover, when the pressure in the furnace increases, SiO aggregates in a portion at about 1100° C. or lower over the melt in the furnace and dust is generated and falls to the melt, so dislocation is generated in the crystal.

Then, silicon is molten by being heated with the heater 102 to obtain the melt (raw material melt) 103. Next, seed-crystal silicon attached to a seed chuck 105 is dipped in the melt (raw material melt) 103, and a crystal 106 is pulled while rotating the crucible (vitreous silica crucible) 101 and a pulling shaft 104. Crystal orientation is set to any one of {100}, {111} and {110}, and seed narrowing is performed to achieve a dislocation free crystal. Then, a shoulder portion is formed to have a target body diameter of, for example, 310 mm.

After that, at a certain pulling speed, a body portion is grown to have a total length of up to, for example, 1200 mm. After tail narrowing is performed by reducing the diameter under the same conditions as normal conditions, crystal growth is completed. Herein, the pulling speed is arbitrarily determined in accordance with resistivity, the single-crystal silicon size, the hot-zone structure (heat circumstance) of a used single crystal pulling device, and the like. For example, a pulling speed, at which a region in which an OSF ring is generated is qualitatively included in a single crystal face, can be employed. A lower limit of the pulling speed can be set to be not lower than the pulling speed at which no dislocation cluster is generated and an OSF ring region is generated in the single crystal face.

In addition, a hydrogen concentration in the inert atmosphere can be set in the range of 3 to 20 vol % with respect to a furnace pressure equal to or higher than 4.0 kPa and equal to or lower than 9.33 kPa (equal to or higher than 30 torr and equal to or less than 70 torr). The furnace pressure is preferably not lower than 1.33 kPa (10 torr), more preferably equal to or higher than 4.0 kPa and equal to or lower than 26.7 kPa (equal to or higher than 30 torr and equal to or lower than 200 torr), and even more preferably equal to or higher than 4.0 kPa and equal to 9.3 kPa (equal to or higher than 30 torr and equal to or lower than 70 torr). When the hydrogen partial pressure is lowered, the hydrogen concentration in the melt and the crystal is lowered. Thus, the lower limit of the pressure is determined to prevent the occurrence of this problem. When the pressure in the furnace increases, the carbon concentration in the crystal becomes higher than a desired value and dislocation is generated in the crystal. Thus, an upper limit of the pressure is determined to prevent the occurrence of this problem. When the pressure in the furnace increases, the gas flow rate of the inert gas such as Ar on the melt decreases and thus it becomes difficult to discharge the carbon degassed from a carbon heater or a carbon member and reaction gas such as SiO evaporating from the melt, so the carbon concentration in the crystal becomes higher than the desired value. Moreover, when the pressure in the furnace increases, SiO aggregates in a portion at about 1100° C. or lower over the melt in the furnace and dust is generated and falls to the melt, so dislocation is generated in the crystal. The hydrogen partial pressure is preferably equal to or higher than 40 pa and equal to or lower than 400 Pa.

A hydrogen concentration in the single-crystal silicon during the growth in the inert atmosphere including hydrogen can be controlled in accordance with the hydrogen partial pressure in the atmosphere. For the introduction of hydrogen into the crystal, the hydrogen in the atmosphere is dissolved in the silicon melt to achieve a stationary state (equilibrium state) and the concentration of a liquid phase and a solid phase are distributed to the crystal by concentration segregation upon solidification.

The hydrogen concentration in the melt is determined depending on the hydrogen partial pressure in a gas phase from Henry's law. The hydrogen concentration in the crystal just after the solidification can be controlled to be a desired concentration constant in an axis direction of the crystal by controlling the hydrogen partial pressure in the atmosphere.

According to such a single-crystal silicon growing method, by pulling single-crystal silicon in an inert atmosphere including hydrogen, the whole area of a crystal radial direction do not include COP and dislocation clusters. Further, by expanding the range of the pulling speed for a PI region, at which a single crystal of the interstitial silicon-predominant region (PI region) can be pulled, and performing a pulling operation, a single crystal body can be provided as an interstitial silicon-predominant region (PI region) without dislocation clusters. At the same time, according to such a single-crystal silicon growing method, by reducing the width of an OSF ring, the range of a pulling speed for a PI region, which had to be very narrowly set when pulling a single crystal free from grown-in defects, is extended, and thus it is possible to very easily grow the grown-in defect free single crystal at a pulling speed higher than a conventional pulling speed. When single-crystal silicon is pulled with the condition under which an OSF ring region is generated in a crystal face, the width of an OSF ring is reduced, so that the influence of the OSF ring can be reduced.

Herein, the range of a pulling speed for a PI region in the hydrogen atmosphere and the range of a pulling speed for a PI region in the inert atmosphere without hydrogen are compared with each other in a state in which the a value of a temperature gradient G in an axis direction in the crystal just after the above-described solidification is constant and does not change.

Figure 5:
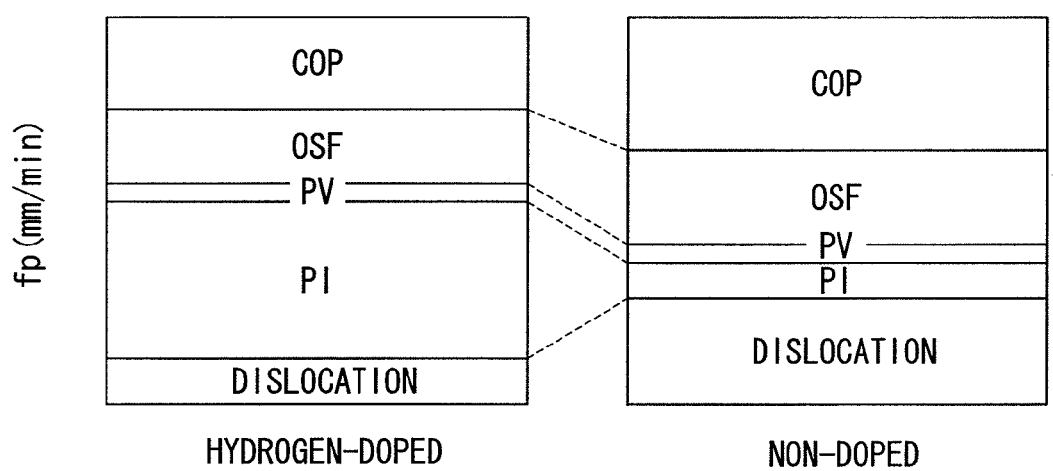
FIG. 5 is a schematic view illustrating the change of a pulling speed region by the addition of hydrogen.

Specifically, by providing a hydrogen atmosphere, the range of a pulling speed for a PI region, at which a grown-in defect free single crystal formed of an interstitial silicon type grown-in defect free region (PI region) can be pulled, can be increased by 4 times or more in the case where there is no hydrogen. For example, as illustrated in FIG. 5, the range is increased by a margin of 4.5 times to perform a pulling operation, and by a pulling speed of such a range, a desired single crystal can be pulled.

At this time, a region in which an OSP ring is generated can be reduced. The size of a PV region (vacancy type grown-in defect free region) does not change by the addition of hydrogen.

In this embodiment, by adding hydrogen as described above, a grown-in defect free single crystal is easily pulled. Further, by adding carbon, the influence of an OSF ring can also be reduced. By the synergistic effect of the oxygen and the carbon, it is possible to reduce the amount of defects occurring by the OSF ring when an epitaxial layer is grown on the wafer, to pull the single crystal having the above-described desired quality, and to improve working efficiency so that manufacturing cost for the single-crystal silicon or the silicon substrate manufactured from the single-crystal silicon can be largely reduced.

In the wafer processing process S2 in FIG. 3 after the single-crystal silicon pulling process S1 illustrated in FIG. 3, the CZ single-crystal silicon, which has a high concentration of boron and to which carbon is added, is processed to obtain a silicon substrate W0 including carbon as illustrated in FIG. 1a.

A method of processing the silicon substrate (wafer) W0 in the wafer processing process S2 is performed in a conventional manner. The carbon added high-concentration boron CZ single-crystal silicon is sliced using a cutting tool such as an ID saw or a wire saw and the obtained silicon wafer is annealed. Then, surface processing such as polishing and cleaning is performed on a surface of the silicon wafer. Various processes either than the above processes, such as lapping, cleaning and grinding, can be performed, and the processes are arbitrarily changed and used in accordance with the purpose intended. That is, the process procedure may be changed and the processes may be omitted.

The silicon substrate W0 obtained in this manner has a boron (B) concentration of a p− type substrate, a carbon concentration equal to or higher than $1.0 \times 10^{16}$ atoms/cm$^3$ and equal to or lower than $1.6 \times 10^{17}$ atoms/cm$^3$, and an oxygen concentration equal to or higher than $1.4 \times 10^{18}$ atoms/cm$^3$ and equal to or lower than $1.6 \times 10^{18}$ atoms/cm$^3$.

In the silicon, the carbon is contained in a solid solution state. Accordingly, the carbon is introduced in the manner of being substituted in place of the silicon in the silicon lattice. That is, the radius of a carbon atom is smaller than the radius of a silicon atom, and thus when the carbon is coordinated at a substitution position, the stress field of the crystal becomes a compressive stress field, and interstitial oxygen and impurities are easily collected in the compressive stress field. For example, in the device forming process S4 to be described later, from the carbon at the substitution position, precipitates of the carbon and the oxygen are formed at a high density together with dislocation, and thus a high gettering effect can be applied to the silicon substrate W0. Accordingly, also in the device forming process S4, sufficient gettering performance can be obtained.

Such an addition concentration of the carbon is required to be controlled in the above-described range. The reason is that, when the carbon concentration is lower than the above range, the formation of the carbon-oxygen-based precipitates is not actively promoted and the above-described formation of the carbon-oxygen-based precipitates cannot thus realized be.

On the other hand, when the carbon concentration is higher than the above range, the formation of the carbon-oxygen-based precipitates is promoted and the carbon-oxygen-based precipitates can be obtained at high densities. However, the size of the precipitates is inhibited, and as a result, distortion around the precipitates has a strong tendency to be reduced. Accordingly, the effect of the distortion becomes weak and the effect of collecting impurities (gettering performance) is reduced.

Further, the oxygen concentration in the silicon substrate W0 is required to be controlled to be within the above range. The reason is that, when the oxygen concentration is lower than the above range, the formation of the carbon-oxygen-based precipitates is not promoted and the above-described high-density carbon-oxygen-based precipitates cannot be thus obtained.

On the other hand, when the oxygen concentration is higher than the above range, the size of the oxygen precipitates is reduced and an effect of distortion in interfaces between maternal silicon atoms and the precipitates is reduced. Thus, there is concern that a gettering effect caused by the distortion is reduced.

Moreover, by providing a higher boron concentration and thereby influencing the precipitates, the formation of composite defects by the boron, carbon and oxygen is promoted.

Next, in the wafer processing process S2 illustrated in FIG. 3, a surface of the silicon substrate W0 which is the carbon added CZ crystal is subjected to mirror-like finishing and then is subjected to, for example, RCA cleaning in which SC1 and SC2 are combined with each other.

After that, in the epitaxial layer forming process S3 illustrated in FIG. 3, an epitaxial layer is grown on the front of the silicon substrate W0. For this process, the silicon substrate W0 is placed in an epitaxial growth furnace and an epitaxial layer W0a having a p type boron (B) concentration is grown using various CVD methods (chemical vapor-phase growth methods), as illustrated in FIG. 1b.

Figure 1B:
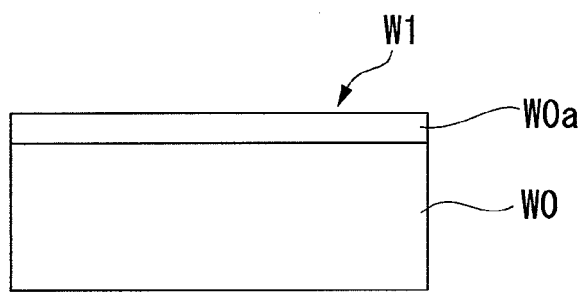
Figure 1C:
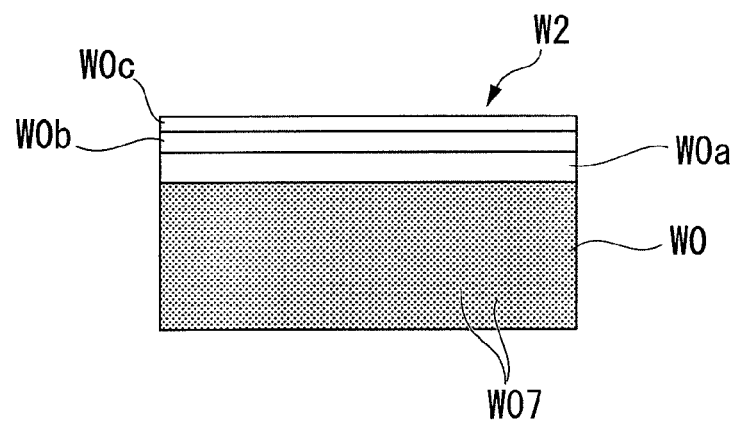

In a p/p− type silicon substrate W1 in which the epitaxial layer W0a is formed as illustrated in FIG. 1b, as illustrated in FIG. 1c, an oxide film W0b and a nitride film W0c are formed on the epitaxial layer W0a as needed to obtain a silicon wafer (silicon substrate) W2. Then, the wafer is provided for the device manufacturing process B.

Herein, the silicon substrate W1 or the silicon substrate W0 of the silicon substrate W2 provided for the device manufacturing process B are the CZ crystal including a boron and carbon solid solution. However, the oxygen precipitates or oxygen precipitation nuclei formed during the growth of the crystal shrink by a heat treatment upon the epitaxial growth, and thus oxide precipitates present in the silicon substrate W0 at the stage of the silicon substrate W1 can not be observed by an optical microscope.

In order to ensure gettering sinks for gettering heavy metal, the following conditions are applied after the growth of the epitaxial layer W0a. A temperature condition for promoting the precipitation of the oxide precipitates and the like is preferably equal to or higher than 600° C. and equal to or lower than 800° C. to perform a low-temperature heat treatment for 0.25 or longer hours and 3 or shorter hours, and precipitating boron-carbon-oxygen-based oxygen precipitates W07 from the carbon at the substitution position is required.

The boron-carbon-oxygen-based precipitates are precipitates which are composites (clusters) containing boron and carbon.

The oxygen precipitates W07 are naturally precipitated over the whole silicon substrate W0 in the middle course of the initial stage of the device manufacturing process B when the silicon substrate W1 containing the carbon solid solution serves as a start member. Accordingly, gettering sinks which have high gettering performance for metal contamination in the device manufacturing process B can be formed over the whole thickness of the silicon substrate W0 from just under the epitaxial layer. Therefore, the gettering in the region near the epitaxial layer is realized.

In order to realize the gettering, the oxygen precipitates (BMD: Bulk Micro Defect) W07, which are the boron-carbon-oxygen-based composites, have a size equal to or more than 10 nm and equal to or less than 100 nm, and the number of the oxygen precipitates present in the silicon substrate W0 is preferably equal to or more than $1.0 \times 10^6$ nuclei/cm$^3$ and equal to or less than $1.0 \times 10^{11}$ nuclei/cm$^3$.

In this case, the size of the BMD is a diagonal length of a precipitate in a TEM observation image of a cross-section in the thickness direction of the silicon substrate and is represented by the average value of the precipitates in the observation visual field.

In addition, the density of the BMD can be measured through the observation of the cross-section after light-etching using an optical microscope.

The reason the size of the oxygen precipitates W07 is equal to or more than the lower limit of the above range is that, the probability of collecting (gettering) interstitial impurities (for example, heavy metal and the like) using the effect of the distortion occurring in the interfaces between the maternal silicon atoms and the oxygen precipitates is increased. Further, oxygen precipitates W07 of a size exceeding the above range is not preferable because they result in the occurrence of a reduction in the strength of the silicon substrate or in generation of dislocation in the epitaxial layer.

In addition, the density of the oxygen precipitates W07 in the silicon substrate is preferably set in the above range because the collecting (gettering) of the heavy metal in the crystal silicon depends on the distortion occurring in the interfaces between the maternal silicon atoms and the oxygen precipitates and an interface state density (volume density).

Figure 2A:
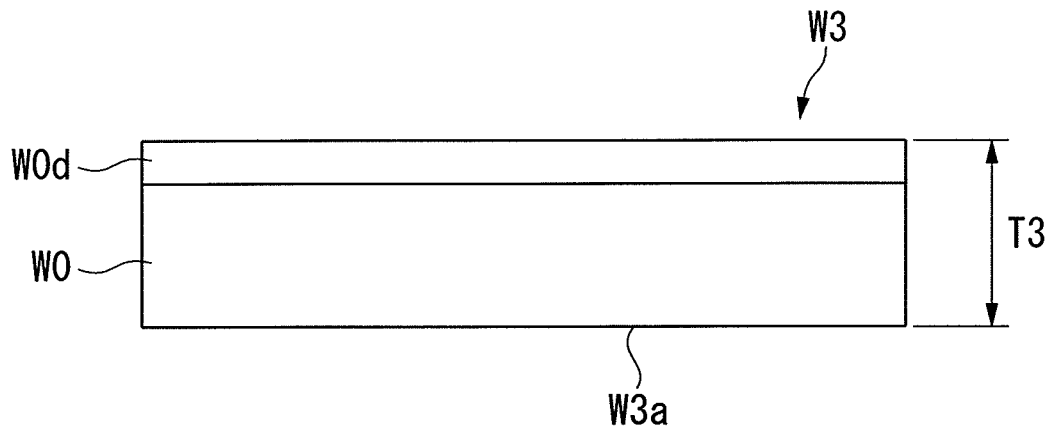
FIGS. 2a to 2c are sectional views illustrating the embodiment of the silicon substrate manufacturing procedure.
Figure 3:
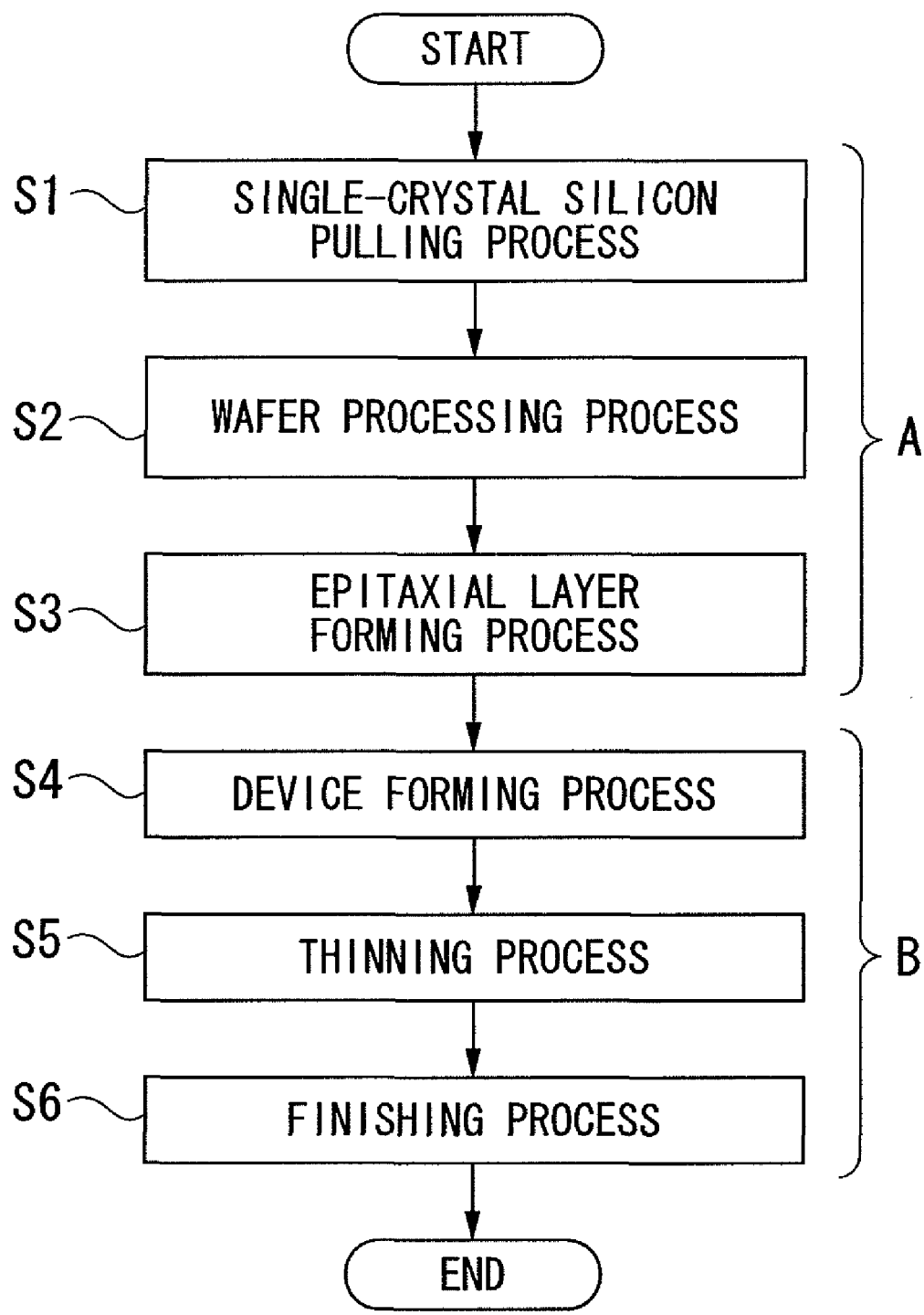
FIG. 3 is a flowchart illustrating the silicon substrate manufacturing procedure according to the invention.

In the device forming process S4 illustrated in FIG. 3, the structure as a device is formed on a front of the silicon wafer W2 illustrated in FIG. 1c, and as illustrated in FIG. 2a, a silicon substrate W3 having the thickness T3 of preferably equal to or more than 500 μm and equal to or less than 1000 μm, more preferably equal to or more than 600 μm and equal to or less than 800 μm, and even more preferably about 700 μm is manufactured. A portion having the device structure in the silicon substrate W3 is a device region W0d.

As the device forming process S4, a normal memory device manufacturing process can also employed be. An example thereof will be described and the invention is not particularly limited to these structure and process.

In the device forming process S4, a metal-oxide-semiconductor field-effect transistor (MOS-FET) having a floating gate is formed. In this manner, the silicon substrate W3, in which a portion which becomes a memory device is formed in a front of the silicon wafer, is manufactured.

In the above device forming process S4, for example, a heat treatment at a temperature equal to or higher than 600° C. and equal to or lower than 1000° C. is generally performed in a gate oxide film forming process, a device separation process, a polysilicon gate electrode forming process and the like. By the heat treatment, the above oxygen precipitates W07 can be precipitated and they can act as gettering sinks in the following processes.

Figure 6:
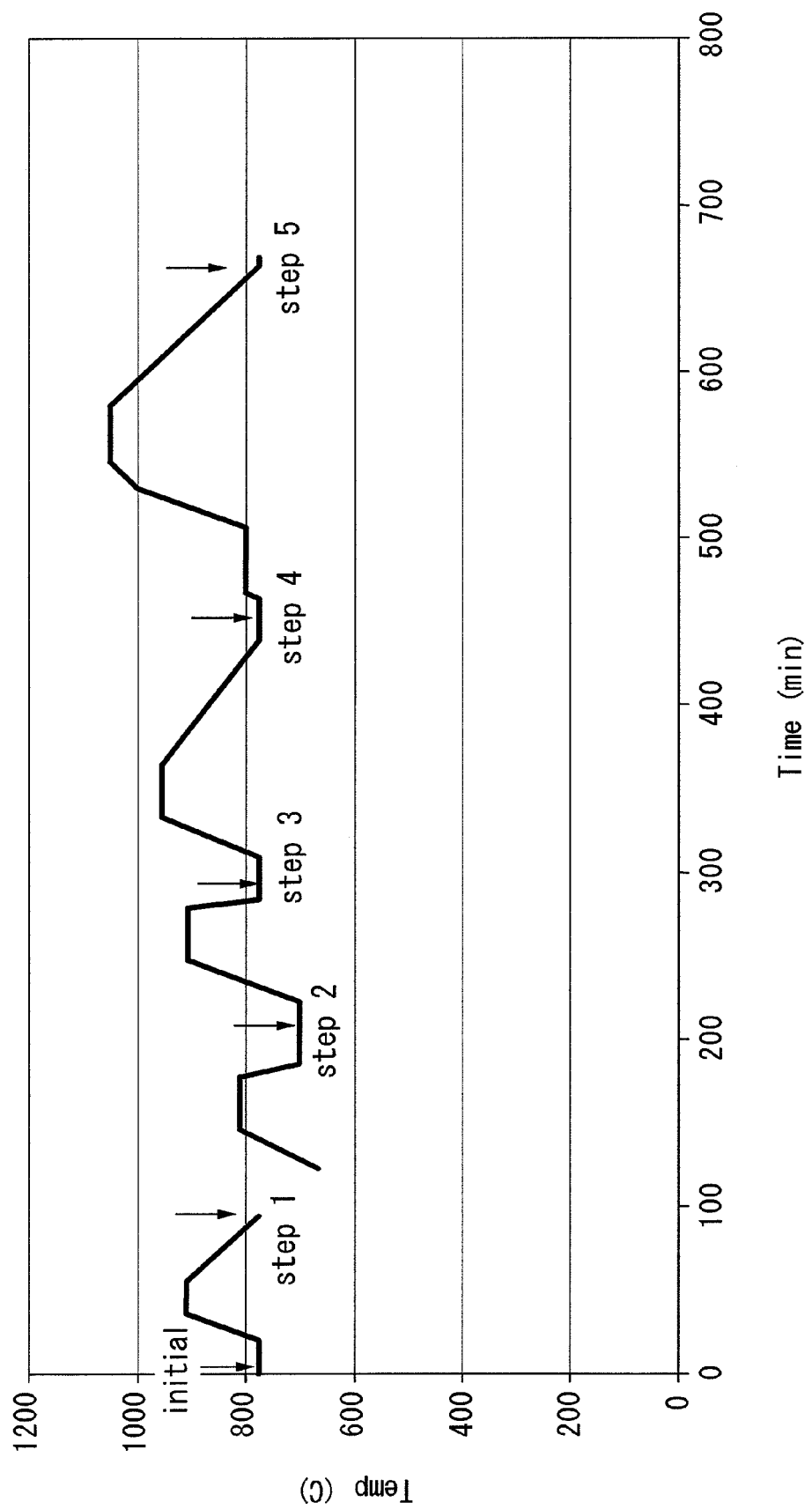
FIG. 6 is a diagram illustrating a heat treatment in the embodiment of the invention.

Heat treatment conditions in the above device forming process S4 can correspond to the respective conditions illustrated in FIG. 6.

When the heat treatment for precipitating the oxygen precipitates W07 is performed before the device manufacturing process B, the heat treatment is preferably performed in a mixed atmosphere of oxygen and inert gas such as argon or nitrogen at a temperature equal to or higher than 600° C. and equal to or lower than 800° C. for equal to or longer than 0.25 hours and equal to or longer than 3 hours. Accordingly, an IG (gettering) effect can be applied to the silicon substrate. The heat treatment may be omitted because a high-concentration boron substrate does not necessarily require the heat treatment.

The reason it is not preferable is that, regardless of being performed during or before the device manufacturing process B, the heat treatment for applying the IG effect is performed at a temperature lower than the above range is that, the boron-carbon-oxygen-based composites are not sufficiently formed and thus the gettering performance is not sufficiently exhibited when the metal contamination occurs in the substrate. In addition, the reason the heat treatment for applying the IG effect is performed at a temperature higher than the above temperature range is not preferable is over-aggregation of the oxygen precipitates occurs and thus the density of the gettering sinks is insufficient.

In the heat treatment, different conditions can be established by increasing or decreasing temperature and processing time, as long as the conditions are within the range of giving the same precipitation as that given under the conditions of 600° C. and 30 minutes. In addition, different conditions can be established by increasing or decreasing temperature and processing time, as long as the conditions are within the range of giving the same precipitation as that given under the conditions of 800° C. and 4 hours.

Subsequently, by the thinning process S5 illustrated in FIG. 3, the silicon substrate W3 becomes a substrate W5 having a thickness preferably equal to or more than 10 μm and equal to or more than 30 μm, and more preferably about 30 μm.

Figure 2B:
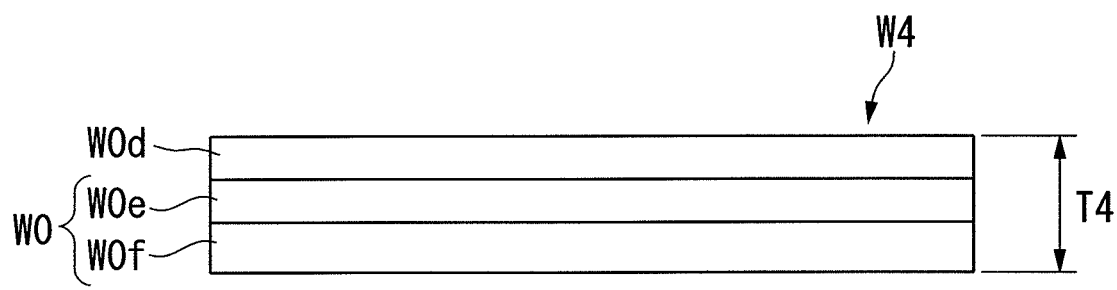

In the thinning process S5 illustrated in FIG. 3, first, in a grinding process, a back face W3a of the silicon substrate W3 having the thickness T3 illustrated in FIG. 2a is grinded so that the thickness is thinned. In this manner, a substrate W4 having the thickness T4 is provided as illustrated in FIG. 2b. The silicon substrate W0 in the silicon substrate W3 becomes a processing-influenced layer W0f and a bulk layer W0e by the grinding process.

For example, conditions for this time are set as follows.

Thickness T3: 700 μm;

Thickness T4: 60 μm (50 to 80 μm); and

Surface State Obtained by Forming Random Processing-Influenced Layer on Back Face: 5 nm Roughness The grinding process is preferably performed by a grinder or the like. The thickness T4 is preferably in the range of 50 to 80 μm. The roughness is preferably in a range of 4 to 8 nm, and more preferably about 5 nm.

Figure 2C:
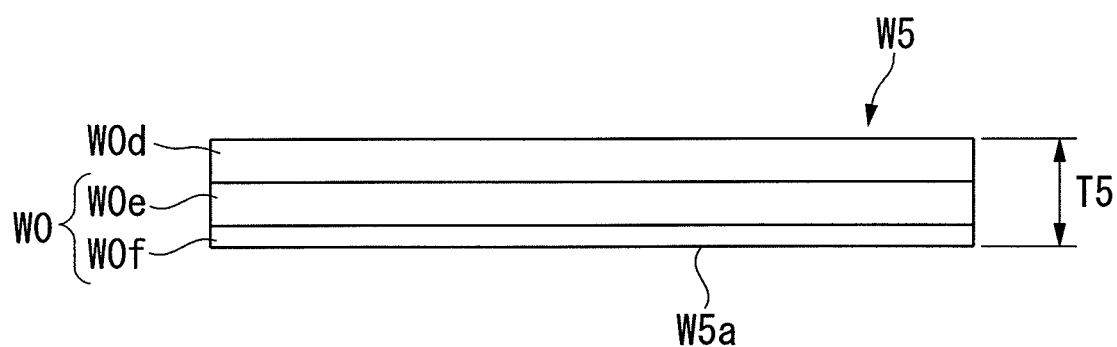

In the thinning process S5, after the grinding process, CMP processing is performed by using a hard slurry which has a hardness equal to or more than about 200 HV and equal to or less than about 1000 HV and is formed of colloidal silica, crystal silicon or diamond-like carbon. Thus, a substrate W5 having a thickness T5 is obtained as illustrated in FIG. 2c.

Conditions for the thinning process are set as follows.
Thickness T5: 30 μm; and
Surface State: 5 nm Roughness The thickness T5 obtained by the CMP processing is preferably in the range of 10 to 40 μm, and more preferably about 30 μm. The roughness is preferably in the range of 4 to 8 nm, and more preferably about 5 nm.

Conditions for the CMP processing are set as follows.

The processing is performed on an alumina surface plate at a pressure equal to or higher than 100 g/cm² and equal to or lower than 500 g/cm² for a processing time equal to or longer than 10 sec and equal to or shorter than 60 sec by using a slurry of which an abrasive grain weight ratio is equal to or more than 1 wt % and equal to or less than 5 wt % and which has a hardness equal to or more than about 200 HV and equal to or less than about 1000 HV and is formed of colloidal silica, crystal silicon or diamond-like carbon having a grain diameter equal to or more than 10 nm and equal to or less than 100 nm.

Then, a polishing process is performed at a pressure equal to or higher than 100 g/cm² and equal to or lower than 500 g/cm² for a processing time equal to or longer than 10 sec and equal to or shorter than 60 sec. In this manner, the substrate W5 has a thickness equal to or more than 5 μm and equal to or less than 40 μm, and extrinsic gettering which produces residual stress equal to or more than 5 Mpa and equal to or less than 200 Mpa is applied to a back face W5a of the substrate W5. At this time, as a surface state of the back face W5a, the back face W5a has about 5 nm of roughness, so the back face W5a has no cracks or chips.

The thickness is preferably equal to or more than 5 μm and equal to or less than 40 μm, more preferably equal to or more than 25 μm and equal to or less than 35 μm, and even more preferably about 30 μm. The roughness is preferably in the range of 3 to 7 nm, and more preferably about 5 nm.

Herein, the residual stress is measured by a section incidence method using a microscopic Raman system.

The roughness can be measured using a Nomarski-type surface roughness measuring device.

In the silicon substrate W5 of this embodiment, by doping carbon upon ingot pulling and thereby adjusting the oxygen concentration to be within a predetermined range, the bulk layer W0e under the DZ layer has IG performance. Further, by stopping the CMP processing midway through the thinning process for the back face W5a of the processing-influenced layer W0f and half-polishing the back face in the polishing process, the back face has EG performance. Accordingly, even when the thickness of the IG layer is reduced by thinning, it is possible to maintain a state in which sufficient gettering performance is provided by the EG of the back face. Thus, even when the silicon substrate is provided for a memory, an MCP corresponding memory substrate, and particularly, a flash memory, which has a thickness T5 of about 30 μm, it is possible to eliminate the influence of metal contamination. Since thinning is performed by the CMP processing and half-polishing, and the process is completed while the texture of the back face is controlled, it is possible to prevent the occurrence of cracking and chipping and provide a high-yield silicon substrate.

Hereinafter, another embodiment of the silicon substrate and the silicon substrate manufacturing method according to the invention will be described with reference to the drawings.

This embodiment is different form the above-described embodiment in that the silicon substrate is used to manufacture a logic device. The same constituent elements are denoted by the same reference symbols and a description thereof will be omitted.

In this embodiment, in a wafer manufacturing process A, a single-crystal silicon ingot having a p+ type boron (B) concentration is pulled and the carbon concentration in an epitaxial layer is a p type concentration. A silicon substrate W3 illustrated in FIG. 7c is a p/p+ type.

Figure 7A:
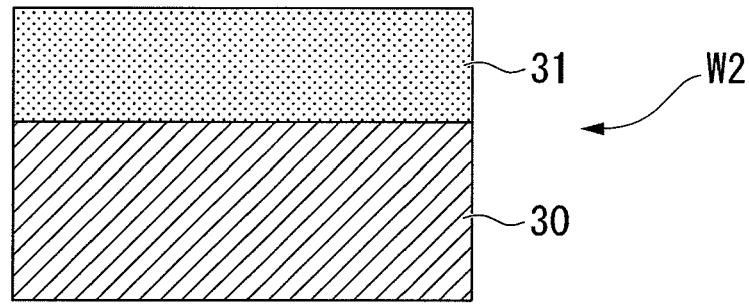
FIGS. 7a to 7c are sectional views illustrating a memory device manufacturing procedure.

First, through the wafer manufacturing process A, a silicon substrate W2 in which a p type epitaxial layer (heavily impurity-doped layer) 31 is formed on a p− type silicon substrate 30 is provided, as illustrated in FIG. 7a.

Figure 7B:
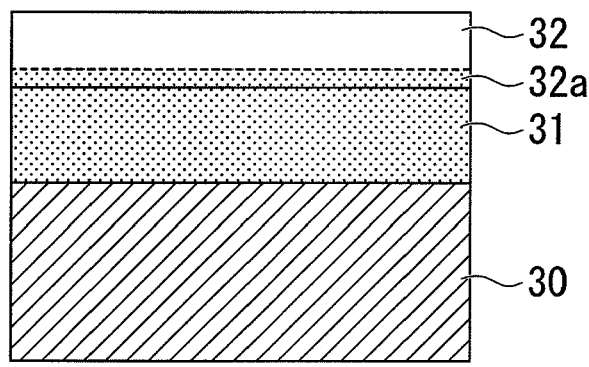
Figure 7C:
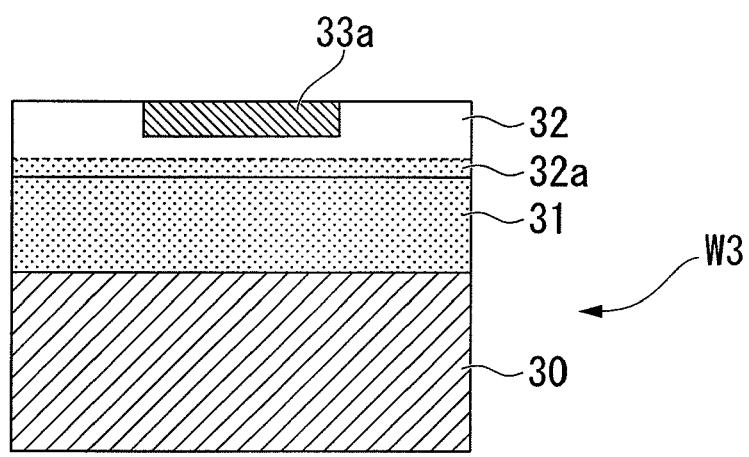

In a device forming process S4, as illustrated in FIG. 7b, a lightly impurity-doped layer 32, which has a lower impurity concentration than the p type epitaxial layer, is formed on the epitaxial layer 31.

Next, as a first pre-annealing process, a heat treatment is performed in an inert gas atmosphere at a temperature of 1000° C. or higher, for example, 1200° C., to remove oxygen in the vicinity of a front of the silicon substrate W2. The occurrence of defects is suppressed by removing the oxygen around the front of the silicon substrate W2.

After the first pre-annealing process, a second pre-annealing process is performed in the inert gas atmosphere at a temperature of 1000° C. or lower, for example, 800° C. to precipitate interstitial oxygen to thereby form a number of crystal defects (oxygen precipitates).

Then, as illustrated in FIG. 7c, a device active region 33a is formed by injecting impurities into the vicinity of the front of the substrate. Furthermore, a lamination structure such as an oxide film or a wiring layer is formed on the front of the substrate, and a transistor or a capacitor (not shown) is formed. After that, a surface protecting film (not shown) for covering the front of the substrate having the device active region 33a formed thereon is formed to obtain the silicon substrate W3.

The device active region (device region) 33a having a p-n junction and the like is formed in the vicinity of the front of the silicon substrate W3. The device active region 33a is formed down to a depth of about 20 μm from the surface of the lower semiconductor chip 30. In the lightly impurity-doped layer 32, an impurity diffusion region 32a in which the boron included in the heavily impurity-doped layer 31 is diffused in the lightly impurity-doped layer 32 is formed. The impurity diffusion region 32a has a thickness of about several μm.

In this manner, the substrate W3, of which the front has a portion which becomes a logic device, is manufactured.

The silicon substrate 30 of the silicon substrate W3 of FIG. 7c corresponds to the silicon substrate W0 of FIG. 2a. The heavily impurity-doped layer 31, the lightly impurity-doped layer 32, the impurity diffusion region 32a and the device active region (device region) 33a correspond to the device region W0d of FIG. 2a.

The silicon substrate W3 having the portion as a logic device becomes an upper semiconductor chip, and it is, for example, a memory semiconductor device other than a DRAM, a CPU, a digital signal processor (DSP) or the like. Also, the silicon substrate may become a lower semiconductor chip, and it is, for example, a memory semiconductor device such as a DRAM. These upper and lower semiconductor chips are connected together with a multi chip package (MCP) by a bonding wire to provide a multi-chip package.

In a thinning process of a device manufacturing process B, a back face of the silicon substrate W3 is processed to have a thickness T5 of about 40 μm as illustrated in FIG. 2c.

In the silicon substrate of this embodiment, by doping carbon upon ingot pulling and thereby adjusting an oxygen concentration to a predetermined range, a bulk under the DZ layer has IG performance. Further, by stopping CMP processing midway through the thinning process for the back face and half-polishing the back face, the back face has EG performance. Accordingly, it is possible to maintain a state in which sufficient gettering performance is provided. Thus, even when the silicon substrate is provided for a logic device and SoC, which have the thickness T5 of about 40 μm, it is possible to eliminate the influence of the metal contamination. In addition, it is possible to prevent the occurrence of cracking and chipping and provide a high-yield silicon substrate.

For example, the silicon substrate can be used as a wafer for a multi-chip package (MCP) such as a NAND-flash memory or a NOR-flash memory. Also in this case, the device has a CMOS structure and thus a high gettering performance caused by IG and EG can be maintained at a boron (B) concentration corresponding to a resistivity equal to or more than $8\times10^{-3}$ Ωcm and equal to or less than $10\times10^{-3}$ Ωcm, a carbon concentration in the range of $1.0\times10^6$ atoms/cm$^3$ to $1.6\times10^{17}$ atoms/cm$^3$, an oxygen concentration in the range of $1.4\times10^{18}$ atoms/cm$^3$ to $1.6\times10^{18}$ atoms/cm$^3$, and a residual stress of the back face in the above range.

Further, an aspect of the invention can be applied to a solid-state image sensing device, so that a normal solid-state image sensing device manufacturing process can be employed as the above-described device forming process S4. As an example thereof, a CCD device is illustrated in FIGS. 8a to 8f, and the invention is not necessarily limited to this.

Figure 8A:
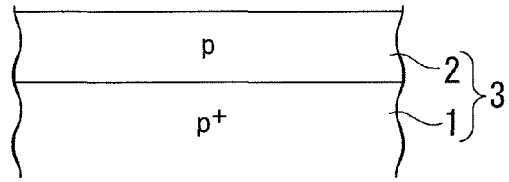
FIGS. 8a to 8f are sectional views illustrating a solid-state image sensing device manufacturing procedure.
Figure 8B:
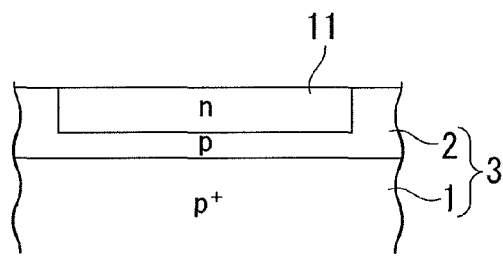
Figure 8C:
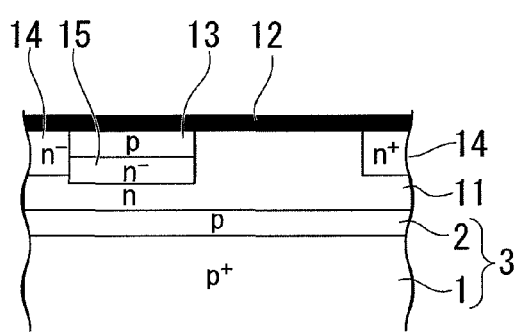

That is, in the device forming process S4, first, a silicon substrate 3, in which a p type epitaxial layer 2 is formed on a p+ type silicon substrate 1 which is the same as that illustrated in FIG. 1b, is provided as illustrated in FIG. 8a. Next, as illustrated in FIG. 8b, a first n type well region 11 is formed at a predetermined position on the epitaxial layer 2. Subsequently, as illustrated in FIG. 8c, a gate insulation film 12 is formed on a surface, and p type and n type impurities are selectively injected by injecting ions into the first n type well region 11 to form a p type transfer channel region 13 constituting a vertical transfer register, an n type channel stop region 14, and a second n type well region 15.

Figure 8D:
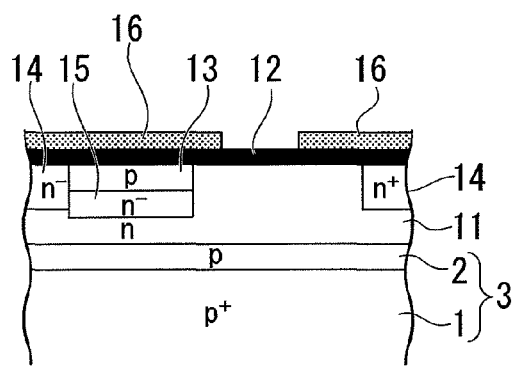
Figure 8E:
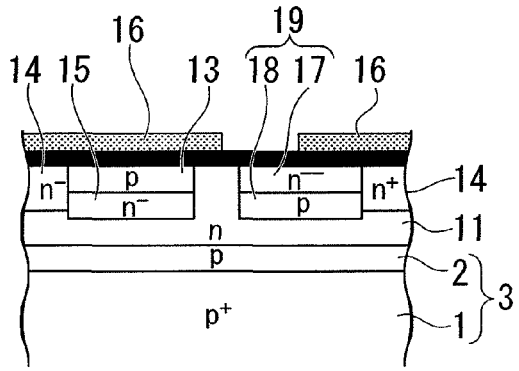

Next, as illustrated in FIG. 8d, a transfer electrode 16 is formed at a predetermined position on a surface of the gate insulation film 12. Then, as illustrated in FIG. 8e, by selectively injecting p type and n type impurities between the p type transfer channel region 13 and the second n type well region 15, a photodiode 19 in which an n type positive charge accumulation region 17 and a p type impurity diffusion region 18 are laminated is formed.

Figure 8F:
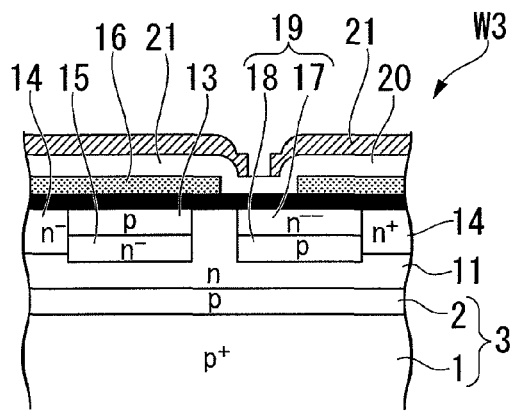

Furthermore, as illustrated in FIG. 8f, an interlayer insulation film 20 is formed on a surface and then a light shielding film 21 is formed on a surface of the interlayer insulation film 20 excluding a portion just above the photodiode 19 to manufacture the substrate W3 which becomes a solid-state image sensing device.

Heat treatment conditions in the forming process S4 of the device which becomes a solid-state image sensing device correspond to the respective conditions illustrated in FIG. 6.

Specifically, in the case of the silicon substrate 3 in which the epitaxial layer 2 is formed (corresponding to the silicon substrate W1 in which the epitaxial layer W0a is formed as illustrated in FIG. 1b), the time points (FIGS. 8a to 8f) at which the processes of the photodiode and transfer transistor forming process are completed respectively correspond to the initial step, the step 1, the step 2, the step 3, the step 4 and the step 5 illustrated in FIG. 6.

When the device becomes a solid-state image sensing device, the thickness of the epitaxial layer 2 (epitaxial layer W0a illustrated in FIG. 1b) is preferably equal to or more than 2 μm and equal to or less than 10 μm to improve spectral sensitivity characteristics of the device.

A solid-state image sensing device may also be provided by forming a buried photodiode in the epitaxial layer W0a of the silicon wafer W2 illustrated in FIG. 1c in the device manufacturing process B.

Due to restrictions on setting a driving voltage of the transfer transistor, the thickness of the oxide film W0b of the silicon wafer W2 is preferably equal to or more than 50 nm and equal to or less than 100 nm, and the nitride film W0c of the silicon wafer W2, specifically, a polysilicon gate film of a solid-state image sensing device is preferably equal to or more than 1.0 μm and equal to or less than 2.0 μm.

A p+ type silicon substrate is preferably used because it facilitates manufacture. Specifically, a so-called latch-up phenomenon in which an unintended parasitic transistor is operated by a floating charge generated during the operation of the device can be prevented by using a p+ type wafer (silicon substrate) and thus device design may be facilitated. In addition, when a capacitor having a trench structure is used, the extension of a depletion layer during the application of a voltage around a trench can be prevented by using the p+ type wafer.

In a high concentration boron (B)-doped single-crystal silicon, oxygen precipitates easily aggregate by a heat treatment, when compared to other dopants. It is thought that this is because impurities such as oxygen and high-concentration boron (B) are clustered and defects having oxygen precipitates as nuclei are easily formed.

Further, it was found that the oxygen precipitates aggregating through the heat treatment resulting from boron prominently appears in crystal silicon having a high oxygen concentration.

The inventors analyzed and inspected the states and behaviors of carbon, oxygen and boron, and as a result, found that, when single-crystal silicon pulling under the conditions of a B concentration corresponding to a resistivity equal to or more than $8\times10^{-3}$ Ωcm and equal to or less than $10\times10^{-3}$ Ωcm, a carbon concentration equal to or higher than $1.0\times10^{16}$ atoms/cm$^3$ and equal to or lower than $1.6\times10^{17}$ atoms/cm$^3$ and an oxygen concentration equal to or higher than $1.0\times10^8$ atoms/cm$^3$ and equal to or lower than $10\times10^{18}$ atoms/cm$^3$ is processed to be a wafer and have an epitaxial layer and is subjected to a heat treatment at a temperature equal to or higher than 600° C. and equal to or lower than 800° C., gettering sinks for gettering heavy metal can be formed in accordance with the size and a density of BMD and a silicon substrate having sufficient gettering performance can be manufactured.

However, in the case of a substrate containing a high concentration of boron of a p+ type, the precipitation can be promoted without the heat treatment.

When carbon in the range of $1.0\times10^{16}$ atoms/cm$^3$ to $1.6\times10^{17}$ atoms/cm$^3$ is added to crystal silicon to which boron is added at a high concentration, gettering sinks having carbon, boron or oxygen as nuclei are formed in the course of crystal growth. They are stably present even after a high-temperature heat treatment and also present even after the epitaxial growth. Accordingly, the gettering sinks act as nuclei of oxygen precipitation just after the epitaxial growth, the gettering sinks grow by the device heat-treatment process, and effectively function as the gettering sinks for heavy-metal contamination in the device heat-treatment process.

The manufacturing method of the invention includes a process of pulling single-crystal silicon having a boron (B) concentration corresponding to a resistivity equal to or more than $8 \times 10^{-3}$ Ωcm and equal to or less than $10 \times 10^{-3}$ Ωcm, a carbon concentration equal to or higher than $1.0 \times 10^{16}$ atoms/cm$^3$ and equal to or lower than $1.6 \times 10^{17}$ atoms/cm$^3$ and an oxygen concentration equal to or higher than $1.4 \times 10^{18}$ atoms/cm$^3$ and equal to and lower than $1.6 \times 10^{18}$ atoms/cm$^3$, and a process of performing a heat treatment for forming oxygen precipitates in a silicon substrate sliced from the pulled single-crystal silicon.

In the manufacturing method of the invention, the heat treatment for forming the oxygen precipitates can be performed at a temperature equal to or higher than 600° C. and equal to or lower than 800° C. for a processing time equal to or longer than 0.25 hours and equal to or shorter than 3 hours in a mixed atmosphere of oxygen and inert gas such as argon or nitrogen.

Further, the manufacturing method of the invention preferably includes a process of forming an epitaxial layer having a boron (B) concentration corresponding to resistivity equal to or more than 0.1 Ωcm and equal to or less than 100 Ωcm on a front of the sliced silicon substrate before the heat treatment for forming the oxygen precipitates.

Furthermore, in the manufacturing method of the invention, hydrogen may be added to the inert atmosphere gas in the growth of the single-crystal silicon. At this time, an atmosphere pressure of the atmosphere in which the hydrogen is added to the inert gas in the process of pulling the single-crystal silicon can be reduced to be equal to or higher than 1.33 and equal to or lower than 26.7 kPa and the concentration of the hydrogen gas in the above atmosphere can be adjusted to equal to or more than 3 vol % and equal to or less than 20 vol %.

Moreover, the silicon substrate of the invention, which is manufactured by the above-described manufacturing method, can employ, means in which defects having a size equal to or more than 10 nm and equal to or less than 100 nm among BMD as intrinsic gettering sinks are present at a density equal to or higher than $1.0 \times 10^6$ nuclei/cm$^3$ and equal to or lower than $1.0 \times 10^{11}$ nuclei/cm$^3$.

In this case, the size of the BMD is a diagonal length of a precipitate in a TEM observation image of a cross-section in a thickness direction of the silicon substrate and is represented by an average value of the precipitates in the observation visual field.

In the case where a silicon substrate as a solid-state image sensing device is obtained according to an aspect of the invention, in the silicon substrate, a gettering layer which includes BMD having a size equal to or more than 10 nm and equal to or less than 100 nm and present at a density equal to or higher than $1.0 \times 10^6$ nuclei/cm$^3$ and equal to or lower than $1.0 \times 10^{11}$ nuclei/cm$^3$ is formed at a position just under a buried photodiode of the solid-state image sensing device. In addition, an epitaxial layer having a boron (B) concentration corresponding to a resistivity equal to or more than 0.1 Ωcm and equal to or less than 100 Ωcm is formed just under the silicon substrate manufactured by the above-described manufacturing method.

The gettering layer is provided just under the epitaxial layer.

Hereinafter, a model which is thought to exhibit high gettering performance will be described.

In the case where carbon is doped into a p– type substrate having a dopant (B) concentration of $1 \times 10^{15}$ atoms/cm$^3$ (equal to or higher than 0.5 atoms/cm$^3$ and equal to or lower than $5 \times 10^{15}$ atoms/cm$^3$) corresponding to a resistivity of 10 Ωcm so that the carbon is present at a higher concentration of $1 \times 10^{17}$ atoms/cm$^3$ (equal to or higher than 0.5 atoms/cm$^3$ and equal to or lower than $1 \times 10^{17}$ atoms/cm$^3$) than the boron (B) concentration, the oxygen concentration is adjusted to be equal to or higher than $1.4 \times 10^{18}$ atoms/cm$^3$ and equal to or lower than $1.6 \times 10^{18}$ atoms/cm$^3$. In this case, since the concentrations of the carbon and the oxygen are equal to or higher than the boron (B) concentration, it is thought that the carbon and the oxygen are easily paired in the substrate. Accordingly, it is thought that, in the crystal silicon, pairs of the carbon and oxygen are formed as combined states related to the gettering sinks.

Herein, the carbon has a smaller atomic radius than the silicon. Therefore, when the carbon enters a lattice point of the silicon, distortion occurs therearound and thus a distortion field is formed. The substrate in this state is subjected to a donor-killer heat treatment or a heat treatment of the device manufacturing process B, so interstitial oxygen is collected in the distortion field around the pairs of the carbon and oxygen, and BMD is formed. In this manner, the carbon is doped into the silicon substrate at a device region or a position in the vicinity of the wafer front in which heavy-metal contamination easily occurs, and the distortion occurs therearound. Thus, heavy metal is diffused and gettered. As a result, a gettering effect can be obtained. That is, the pairs of the carbon and oxygen become the nucleation centers of the oxygen precipitates.

On the other hand, in the case where a highly-doped p+ type or p++ type substrate having a dopant (B) concentration of about $1 \times 10^{18}$ atoms/cm$^3$ (equal to or higher than $0.5 \times 10^{18}$ atoms/cm$^3$ and equal to or lower than $5 \times 10^{18}$ atoms/cm$^3$) is used, the boron (B) concentration is higher than that of the p– type substrate by about 3 digits. Accordingly, it is thought that, due to the influence of the boron (B) concentration increased to be almost equal to the carbon concentration and the oxygen concentration, the boron and the oxygen, and the carbon and the boron are more easily paired than the carbon and the oxygen as compared to the p– type substrate. Further, a number of composites, such as composites of the carbon and oxygen, composites of the boron and oxygen, composites of the carbon and boron, and composites of the carbon, boron and oxygen, are formed together with the composites related to the silicon. They have distortion fields like the pairs of carbon and oxygen, so all of the pairs and composites serve as precipitation nuclei. That is, since the number of the distortion fields can be formed in the highly-doped substrate, an even larger number of the precipitation nuclei are present when compared to the substrate having the p– type boron (B) concentration, and the density of the precipitates capable of becoming gettering sinks increases significantly.

It is anticipated that interstitial silicon (interstitial-Si) and vacancies in the crystal silicon are related to the formation of the composites.

In the silicon substrate of the invention, these precipitation nuclei serve as composite defects formed by boron, carbon and oxygen.

In the manufacturing of an image sensing device, it is very important to prevent heavy-metal contamination. Accordingly, with IG occurring by the above B and O, and EG form on a back face of the substrate a texture for EG, sufficient gettering performance can be obtained.

A p/p+ type silicon substrate is effective as a silicon substrate for a device sensitive to heavy-metal contamination due to its strong gettering characteristics. In addition, in the electronic device manufacturing process B, flatness of the silicon substrate is influenced by a device yield as miniaturization of wiring advances, so high-flatness is required. A p+ type substrate, which has a high boron concentration and into which carbon is doped as in the silicon substrate of the invention, can have sufficient gettering performance without the formation of PBS deteriorating flatness.

Further, it is required to exhibit sufficient gettering performance until the start of the device manufacturing process B and maintain the gettering performance during the device process. Accordingly, in the manufacturing process of a p type silicon substrate, when carbon is not doped, an oxygen concentration is preferably increased to be equal to or higher than $10 \times 10^{18}$ atoms/cm$^3$ and equal to or lower than $20 \times 10^{18}$ atoms/cm$^3$ to enhance the precipitation. However, when the oxygen concentration in the substrate is increased as described above, there is concern that, epitaxial defects in which dislocation extends up to the epitaxial layer are formed. Accordingly, by doping carbon at the above concentration as in the silicon substrate of the invention, there is an effect that the occurrence of large stacking faults (SF) having a size of about 0.5 μm or more is suppressed.

As in the silicon substrate of the invention, by doping carbon (C) in the above concentration, the extension of secondary defects from the precipitation nuclei can be suppressed. In precipitates having a size of 0.5 to 5 μm, secondary dislocation is generated around the distortion fields to eliminate the distortion which had occurred. However, by doping C as described above, a number of precipitates having a size of 0.5 to 100 nm can be formed. Thus, even when the distortion is eliminated, only small secondary dislocation is generated, and as a result, the dislocation does not extend up to the epitaxial layer. Such small precipitation nuclei are numerously present at a density equal to or higher than $1.0 \times 10^{10}$ nuclei/cm$^3$ and equal to or lower than $1.0 \times 10^{13}$ nuclei/cm$^3$, and thus sufficient gettering performance can be exhibited.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A silicon substrate manufactured from a single-crystal silicon produced by a CZ method, wherein the single-crystal silicon includes a carbon concentration equal to or higher than $1.0 \times 10^{16}$ atoms/cm$^3$ and equal to or lower than $1.6 \times 10^{17}$ atoms/cm$^3$ and an initial oxygen concentration equal to or higher than $1.4 \times 10^{18}$ atoms/cm$^3$ and equal to or lower than $1.6 \times 10^{18}$ atoms/cm$^3$;

wherein the silicon substrate includes;
a device formed on a front of the silicon substrate, and
a random processing-influenced layer formed on a back face of the silicon substrate; wherein
the silicon substrate has a thickness of equal to or more than 5 μm and equal to or less than 40 μm, and
a residual stress of equal to or more than 5 Mpa and equal to or less than 200 Mpa applied to the random processing-influenced layer by polishing the back face of the silicon substrate at a pressure equal to or higher than 100 g/cm$^2$ and equal to or lower than 500 g/cm$^2$ for a polishing time equal to or longer than 10 seconds and equal to or shorter than 60 seconds; and
the residual stress acts as extrinsic gettering.

2. The silicon substrate according to claim 1, wherein the residual stress is applied by subjecting the back face of the silicon substrate to grinding and subsequent CMP processing.

3. The silicon substrate according to claim 1, wherein the residual stress is applied by subjecting the back face of the silicon substrate to grinding and subsequent CMP processing using a hard slurry which has the hardness equal to or more than about 200 HV and equal to or less than about 1000 HV and is formed of colloidal silica, crystal silicon or diamond-like carbon.

4. A silicon substrate manufacturing method comprising:
growing single-crystal silicon which has a carbon concentration equal to or higher than $1.0 \times 10^{16}$ atoms/cm$^3$ and equal to or lower than $1.6 \times 10^{17}$ atoms/cm$^3$ and an initial oxygen concentration equal to or higher than $1.4 \times 10^{18}$ atoms/cm$^3$ and equal to or lower than $1.6 \times 10^{18}$ atoms/cm$^3$ by a CZ method;
manufacturing a wafer by slicing the single-crystal silicon;
forming a device on a front of the wafer;
reducing the thickness of the wafer in which the device is formed up to 5 μm or more and 40 μm or less, wherein
the reducing process includes polishing a back face of the silicon substrate at a pressure equal to or higher than 100 g/cm$^2$ and equal to or lower than 500 g/cm$^2$ for a polishing time equal to or longer than 10 seconds and equal to or shorter than 60 seconds in order to apply a random processing-influenced layer acting as extrinsic gettering and having a residual stress of equal to or more than 5 Mpa and equal to or less than 200 Mpa.

5. The silicon substrate manufacturing method according to claim 4, wherein the process of producing the residual stress includes grinding and subsequent CMP processing subjected to the back face of the silicon substrate.

6. The silicon substrate manufacturing method according to claim 4, wherein the process of producing the residual stress includes grinding subjected to the back face of the silicon substrate and subsequent CMP processing using a hard slurry which has a hardness equal to or more than about 200 HV and equal to or less than about 1000 HV and is formed of colloidal silica, crystal silicon or diamond-like carbon.

7. A silicon substrate manufactured by the manufacturing method according to claim 4, comprising a memory device as the device.

8. A silicon substrate comprising:
a memory device which is manufactured by the manufacturing method according to claim 5.

9. A silicon substrate comprising:
a memory device which is manufactured by the manufacturing method according to claim 6.

* * * * *